(12) United States Patent
Guillory

(10) Patent No.: US 6,201,318 B1
(45) Date of Patent: Mar. 13, 2001

(54) HEADLIGHT WARNING SYSTEM

(75) Inventor: Ron M. Guillory, Hillsboro, OR (US)

(73) Assignee: Clairmont, Hillsboro, OR (US)

( * ) Notice: Subject to any disclaimer, the term of this patent is extended or adjusted under 35 U.S.C. 154(b) by 0 days.

(21) Appl. No.: 09/241,877

(22) Filed: Feb. 2, 1999

(51) Int. Cl.[7] .................................................. G01R 31/36
(52) U.S. Cl. ............... 307/10.7; 307/10.1; 320/DIG. 21; 323/368; 340/457.2; 340/636
(58) Field of Search ................................. 307/10.1, 10.7, 307/10.8, 64, 66; 340/457.2, 457, 636, 663, DIG. 21; 327/511; 323/368; 324/117 H

(56) References Cited

U.S. PATENT DOCUMENTS

| 2,756,408 | 7/1956 | McKaig ................................. 340/52 |
| 2,780,797 | 2/1957 | Gooding ............................... 340/52 |
| 2,942,235 | 6/1960 | Warhurst .............................. 340/52 |
| 3,467,831 | 9/1969 | Wilson et al. ........................ 347/10 |
| 3,898,612 | 8/1975 | Lee ..................................... 340/52 D |
| 3,905,013 | * 9/1975 | Lee .................................. 340/457.2 |
| 4,058,793 | 11/1977 | Copeland ........................... 340/52 D |
| 4,104,613 | 8/1978 | Chaput ................................ 340/52 D |
| 4,151,505 | * 4/1979 | Swinny ............................. 340/457.2 |
| 4,283,643 | * 8/1981 | Levin .................................. 323/368 |
| 4,493,001 | * 1/1985 | Sheldrake ........................... 307/10.7 |
| 4,539,520 | 9/1985 | McBride ............................. 324/117 |
| 4,994,728 | * 2/1991 | Sasaki ........................... 320/DIG. 21 |
| 5,041,761 | 8/1991 | Wright et al. ....................... 315/129 |

* cited by examiner

*Primary Examiner*—Albert W. Paladini
(74) *Attorney, Agent, or Firm*—Lyon P.C.

(57) ABSTRACT

A headlight warning system incorporates an engine running sensor and a headlight sensor coupled to a control circuit for activating a warning device, such as a buzzer, when the headlights have been left on for a first period of time after the engine has stopped running, and for deactivating the warning device either after a second period of time, if the engine is started, or if the headlights are shut off. The engine running sensor inductively senses a vehicle ignition signal. The headlight sensor magnetically senses the current in one of the battery cables using a Hall effect sensor in series with a magnetic flux collector encircling the battery cable. If the battery current exceeds an adjustable threshold, the headlights are assumed to be on. Following the deactivation of the warning device after the second period of time, the headlight warning system is reset by either starting the engine or by shutting off the headlights. The headlight warning system is self-contained, requires no modification of the existing vehicle electrical system, and is easy to install for retrofit applications.

33 Claims, 4 Drawing Sheets

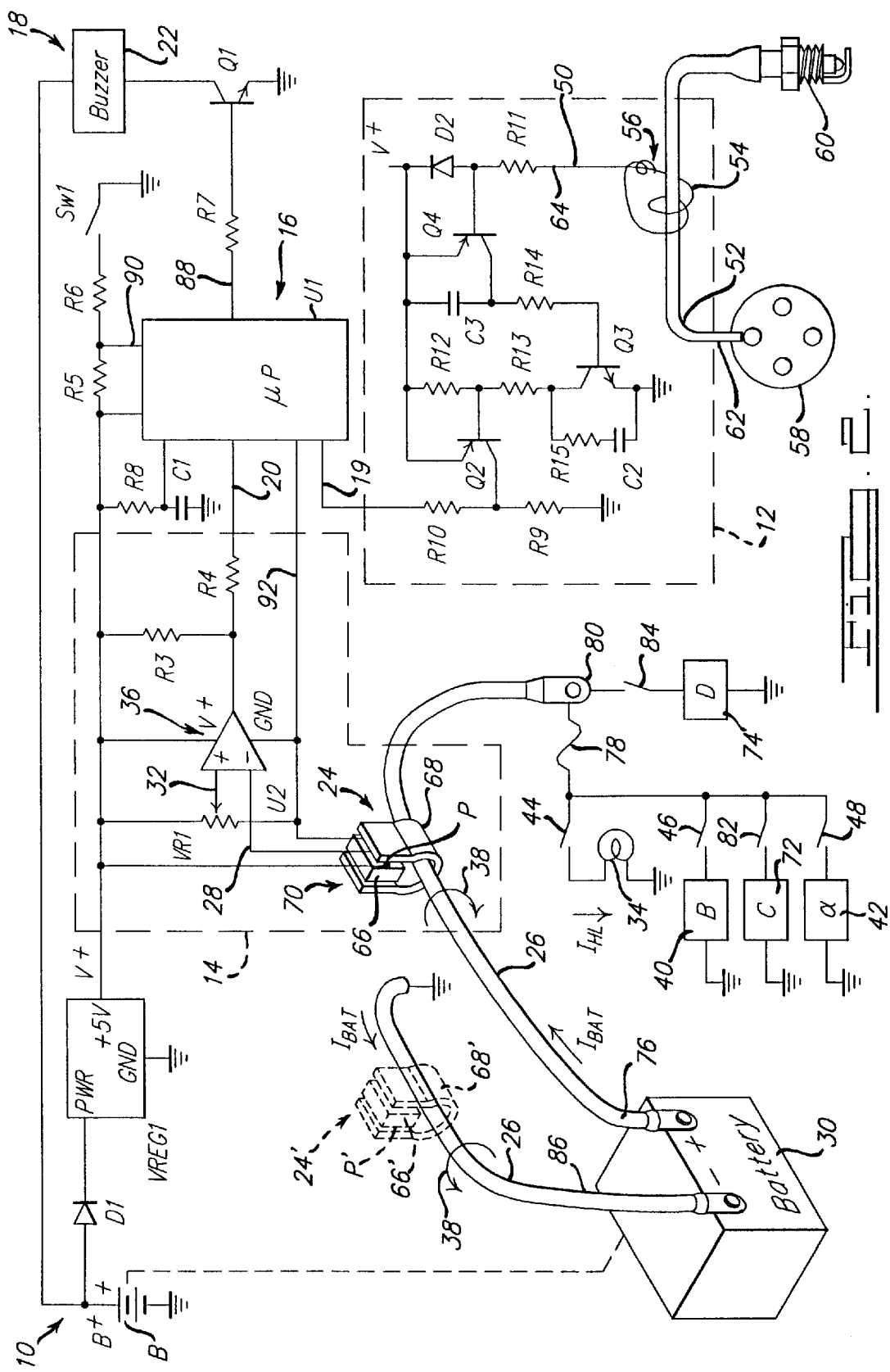

HEADLIGHT WARNING SYSTEM

TECHNICAL ART

The instant invention generally relates to systems for warning of discharge to a motor vehicle battery, and more particularly for warning if the headlights have been left on after stopping the engine.

BACKGROUND OF THE INVENTION

One problem that can be annoying, inconvenient, and sometimes dangerous to those who depend upon motor vehicles is having the motor vehicle battery become discharged by leaving the lights on after stopping the engine and departing the vehicle. This problem is most likely to occur when driving under conditions when lights are necessary for at least some portion of the trip except at the destination, as for example when beginning a trip before dawn and arriving after the sun has risen, or as a result of variable weather conditions.

In order to prevent this problem, some vehicles are equipped with buzzers that are activated if the headlights are on, the key is removed from the ignition, and the vehicle door is opened. Other vehicles, particularly older vehicles, have no such warning system.

One problem with prior art systems is that they must be built into the existing vehicle electrical system, which can create difficulties for the average consumer. Another problem with prior art systems that rely upon switch contacts—for example door switches—for operation is that the switch contacts can become dirty or corroded so that the system fails to function properly, thereby leaving the driver with a false sense of security that the vehicle battery will not become discharged by inadvertently leaving the lights on. Yet another problem with some prior art systems is that they incorporate energy dissipating circuit elements in series with the vehicle lighting system, and accordingly are a source of energy loss which causes reduced fuel economy and reliability. Yet another problem with some prior art systems is that the warning device is continuously activated as long as the problem is present, without any provision for deactivating the warning system, which can be annoying to drivers, particularly if they intentionally wish to have the lights on.

U.S. Pat. No. 5,041,761 teaches a coil in series with a lamp circuit and wound around a magnetically permeable core which has a gap within which is placed a magnetic flux sensor. When the lamp is on, a current in the coil creates a magnetic field in the magnetically permeable core that is sensed by the magnetic flux sensor, which switches an open collector transistor that drives an automotive circuit. One disadvantage of this invention, particularly for retrofit applications, is that the lamp circuit must be interrupted to insert the current sensor. Furthermore, this sensor is not responsive to whether or not the engine is running, nor does it provide any override or time-out features.

U.S. Pat. No. 4,104,613 teaches a vehicle headlight alarm comprising a relay coil in series with the current to the headlights and taillights, and a normally open associated relay switch in series with the current provided by the vehicle battery through the vehicle ignition switch—when in the OFF position—to an audible alarm. When the lights are on, the relay coil closes the associated relay switch, and if the ignition switch is off, the audible alarm is activated by the current provided by the vehicle battery through both the OFF-positioned ignition switch and the closed contacts of the associated relay switch. One disadvantage of this invention, particularly for retrofit applications, is that it requires modification of the existing electrical system. A relay coil must be inserted in the lamp circuit for headlight sensing, and an ignition switch with contacts which are open when ignition is on, and closed when ignition is turned off, is required for detecting the operative state of the engine. Furthermore, this invention is not responsive to whether the engine is actually running, and therefore generating power. Yet further, the circuitry added to the lighting circuit causes excessive power to be consumed when the lights are on. Yet further, there are no override or time-out features in the control of the warning device.

U.S. Pat. No. 4,058,793 teaches a vehicle headlight warning circuit that connects between the non-battery terminals of the vehicle headlight switch and the vehicle ignition switch that generates an audible warning if the headlights are turned on when the vehicle ignition switch is off. One disadvantage of this invention is that current is passed through the ignition circuit when the ignition is off if the headlights are on. Furthermore, this invention requires a conductive path to ground through the ignition system when the ignition system is off. Yet further, this invention does not provide any time-out control of the associated warning device.

U.S. Pat. No. 3,898,612 teaches a headlight warning system including a buzzer unit having a relay coil that is activated by either the ignition switch, or by the headlight switch through the associated normally closed relay coil contacts. If the ignition switch is turned off while the headlights are on, the relay coil is alternately activated and deactivated, causing the relay contacts to emit an audible warning signal. One disadvantage of this invention, particularly for retrofit applications, is that it requires modification of the existing electrical system. Furthermore, there is a continuous current through an associated relay coil when the ignition is on, which wastes power. Yet further, there are no override or time-out features in the control of the warning device.

U.S. Pat. No. 3,467,831 teaches a circuit breaker for vehicle lights incorporating at least one relay circuit in the vehicle electrical system for automatically shutting off the vehicle lights when a vehicle door is opened after the ignition has been turned off with the lights left on. One disadvantage of this invention is that it automatically shuts the lights off when the ignition is turned off, which may be contrary to the wishes of the driver. Furthermore, this invention would be relatively difficult to retrofit to an existing vehicle, and requires modification of the existing electrical system.

U.S. Pat. Nos. 2,942,235, 2,780,797, 2,756,408 teach other arrangements for systems to warn drivers when the headlights have been left on after the ignition has been turned off. Each of these systems incorporate relays integrated into the vehicle electrical system. Accordingly, one disadvantage of these inventions, particularly for retrofit applications, is that they require modification of the existing electrical system.

U.S. Pat. No. 4,539,520 teaches the use of a Hall effect sensor in combination with a magnetic flux collector to sense the current in an existing current carrying conductor that is part of an electrical power transmission system.

SUMMARY OF THE INVENTION

The instant invention overcomes the above-noted problems by providing a headlight warning system comprising the combination of an engine running sensor and a headlight sensor, and a control circuit dependent therefrom that controls a controlled circuit. The control circuit determines from the headlight sensor if the headlights are likely to be on, and from the engine running sensor if the engine is likely to be running. The control circuit is preferably a microprocessor circuit, and the controlled circuit is preferably a warning device such as a buzzer that provides an audible warning.

The headlight sensor senses whether the headlights are on by sensing the magnetic field proximate to an associated current carrying conductor. A magnetic flux sensor in series with a magnetic flux collector encircles the current carrying conductor. Preferably the magnetic flux sensor is a Hall effect sensor, and the current carrying conductor is one of the vehicle battery cables. The headlight sensor detects that the headlights are on if the sensed current is greater than a threshold value corresponding to the current required to operate one or more headlights, wherein the threshold value is adjustable in accordance with a setup procedure.

The engine running sensor comprises a conductor wrapped around one of the engine ignition wires, wherein an ignition signal is induced in the wire when the engine is running, which is then detected by associated circuitry.

If the engine is running, then the warning device is not activated, whether or not the headlights are in use. If the engine is shut off with the headlights on, then after a first delay period, the microprocessor activates the warning device for a second delay period, during which time the warning device would be deactivated if the headlights are shut off or the engine is started. Thereafter, the warning device is deactivated, and the headlight sensor and the engine running sensor are monitored thereafter at intervals defined by a third delay period, at which time the system is reset if either the headlights are shut off or the engine is started.

The source of power for the headlight warning system of the instant invention can be either its own battery, or the vehicle battery. In the former case, the system is entirely self-contained, and can be readily installed in the motor vehicle without disrupting the existing vehicle electrical system.

Accordingly, one object of the instant invention is to provide an improved headlight warning system that provides a warning if the headlights of the motor vehicle have been left on after the engine has been shut off.

A further object of the instant invention is to provide an improved headlight warning system that is easy to install into the motor vehicle without disrupting the existing vehicle electrical system.

A yet further object of the instant invention is to provide an improved headlight warning system that is responsive to both whether the engine is likely to be running and to whether the headlights are likely to be on.

A yet further object of the instant invention is to provide an improved headlight warning system that is reliable and efficient.

In accordance with these objectives, one feature of the instant invention is a headlight sensor that senses headlight current by sensing the magnetic flux that is generated by an associated current carrying conductor.

Another feature of the instant invention is a means for adjusting the current threshold necessary for the headlight sensor to detect that the headlights are on.

Another feature of the instant invention is, in one embodiment, a Hall effect magnetic flux sensor incorporated in a magnetic circuit that includes a magnetic flux collector and which encircles one of the vehicle battery cables.

Yet another feature of the instant invention is an engine running sensor that senses the running state of the engine from a signal induced in a conductor that is wrapped around one of the ignition cables of the engine.

Yet another feature of the instant invention is a control circuit that controls both the activation of the headlight sensor, and the activation and timing of a warning device.

The specific features of the instant invention provide a number of associated advantages. One advantage of the instant invention with respect to the prior art is that the instant invention can be installed in a motor vehicle without disrupting the existing electrical system.

Another advantage of the instant invention is improved reliability because the headlight and engine running sensors do not rely upon mechanical switch contacts.

Yet another advantage of the instant invention is the ease of installation in a motor vehicle, particularly for retrofit applications.

These and other objects, features, and advantages of the instant invention will be more fully understood after reading the following detailed description of the preferred embodiment with reference to the accompanying drawings and viewed in accordance with the appended claims. While this description will illustrate the application of the instant invention in headlight warning systems, it will be understood by one with ordinary skill in the art that the instant invention can also be applied to sensing whether any load is discharging a vehicle battery, either after the motor vehicle has been shut off or during normal operation.

BRIEF DESCRIPTION OF THE DRAWINGS

FIG. 2 is a schematic diagram of the instant invention.

DETAILED DESCRIPTION OF THE PREFERRED EMBODIMENT(S)

Figure 1:
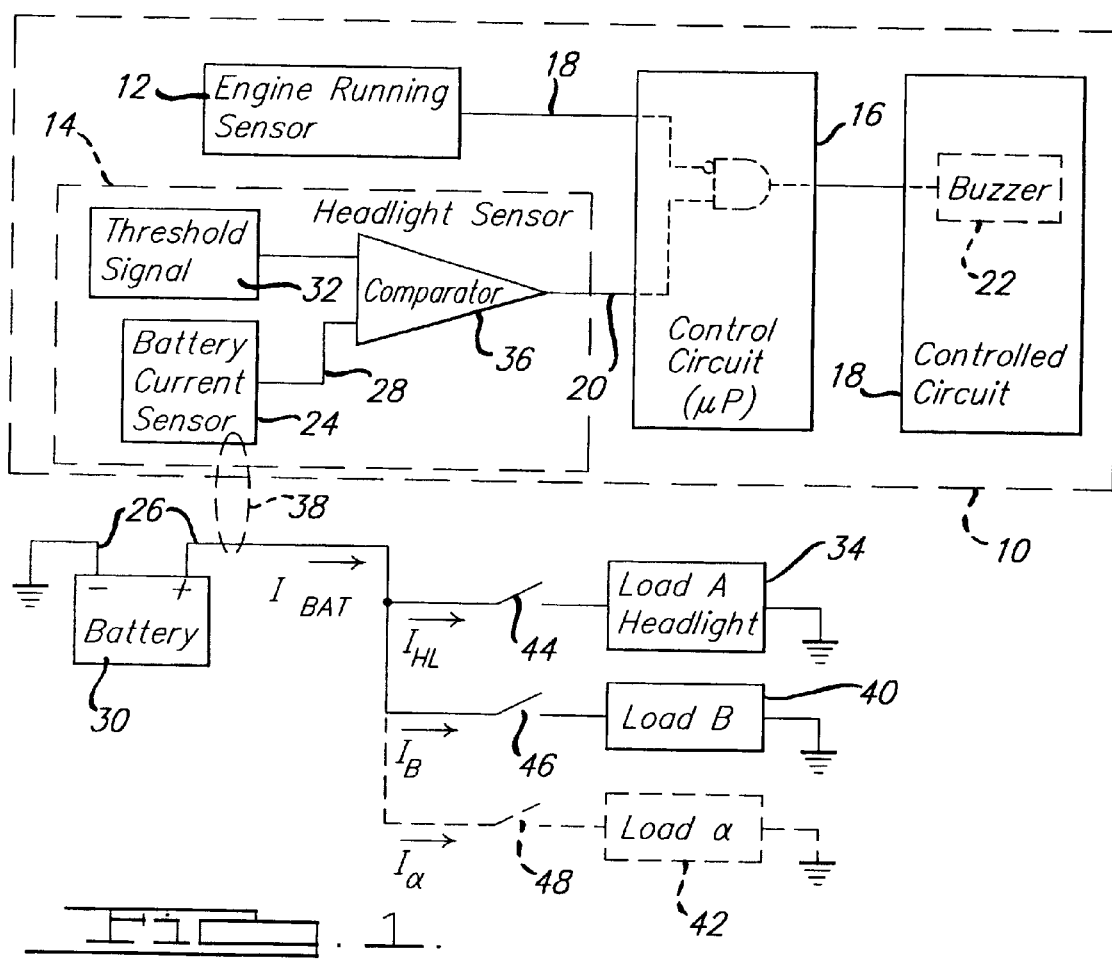
FIG. 1 is a block diagram of the instant invention.

Referring to FIG. 1, a headlight warning system 10 comprises an engine running sensor 12 and a headlight sensor 14, each coupled to a control circuit 16 that controls a controlled circuit 18. The engine running sensor 12 generates an engine running signal 19 that if active, indicates that the vehicle engine likely to be running. The headlight sensor 14 generates a headlight signal 20 that is active if one or more headlights are turned on. The controlled circuit 18 is typically a buzzer 22 or other warning device that is activated by the control circuit 16 if the engine running signal 19 is inactive and the headlight signal 20 is active. The headlight sensor 14 comprises a current sensor 24 that senses the battery current $I_{BAT}$ in one of the battery cables 26 connected to the vehicle battery 30 and generates a current signal 28 that indicates the amount of current in the battery cable 26; a threshold signal 32 that corresponds to the current signal 28 when at least one headlight 34 is on; and a comparator 36 for comparing the current signal 28 to the threshold signal 32 and for generating the headlight signal 20, which is active if the current signal 28 is greater than the threshold signal 32, and is inactive if the current signal 28 is less than the threshold signal 32. The current sensor 24 is proximate to one of the battery cables 26 and senses the battery current IBAT by sensing the corresponding magnetic field 38 that circulates about the battery cable 26 in accordance with the right-hand rule.

A plurality of electrical loads 32, 40 and 42 are connected to the vehicle battery 30 via a corresponding plurality of switches 44, 46 and 48, each respective switch controlling the activation of the respective electrical load. For example, the headlight switch 44 controls the activation of the headlights 32. The battery current $I_{BAT}$ is equal to the sum of the currents through the respective loads $I_{HL}$, $I_B$, $I_A$.

In operation, when the headlights 34 are on, the current signal 28 generated by the current sensor 24 is greater than the threshold signal 32, causing the comparator 36 to activate the headlight signal 20. If also the engine is stopped, then the engine running signal 19 from the engine running sensor 12 is inactive. In an elementary embodiment of the instant invention, if the engine running signal 19 is inactive, and the headlight signal 20 is active, then the control circuit 16 activates a buzzer 22 that audibly warns the driver to shut off the headlight switch 44 so as to not discharge the vehicle battery 30. Alternately, the control circuit 16 is adapted to activate the buzzer 22 for a second preset period of time, after the headlights 34 have been on for a first preset period of time while the engine is stopped.

Referring to FIG. 2, illustrating a preferred embodiment of a headlight warning system 10 in accordance with the block diagram of FIG. 1, the engine running sensor 12 senses an engine ignition signal with a wire 50 that is wrapped around one of the spark plug wires 52 so as to form a coil 54 with typically two (2) turns. The end of the wire 50 is preferably wrapped 56 around the wire 50 so as to mechanically secure the connection, wherein the wire elements of the connection are electrically insulated from one another. The wire 50 is typically electrically insulated along its length. A high voltage ignition signal 62 from the distributor 58 (or directly from the associated ignition coil as for example in a distributorless ignition system) to a spark plug 60 through an associated spark plug wire 52 induces an ignition sense signal 64 in the wire 50 that is typically a high voltage, high impedance, oscillatory signal. The ignition sense signal 64 is operatively coupled through resistor $R_{11}$ to transistor $Q_4$ and associated diode $D_2$, and capacitor $C_3$; then through resistor $R_{14}$ to transistor $Q_3$ and associated resistors $R_{12}$, $R_{13}$, and $R_{15}$ and capacitor $C_2$; then through resistor $R_{14}$ to transistor $Q_2$ and associated resistor $R_9$; and finally through resistor $R_{10}$ so as to form the engine running signal 19. The circuitry that transforms the ignition sense signal 64 into the engine running signal 19 constitutes a detector. One of ordinary skill in the art will recognize that a variety of detector circuits are possible for making this transformation, and that the circuit illustrated in FIG. 2 is an example of one such circuit.

The circuitry of the engine running sensor 12 is powered by an electronic supply voltage V+—typically 5 volts—that is generated by the voltage regulator $VREG_1$ which is supplied through diode $D_1$ from a battery B that may be either distinct from or common to the vehicle battery 30. For example, in one embodiment, the battery B comprises a separate 9 volt transistor battery, so that the headlight warning system 10 is entirely self-contained.

In operation, with the engine not running, there is no ignition signal 62, and thus no ignition sense signal 64, so that transistors $Q_4$, $Q_3$, and $Q_2$ are biased off, thereby causing the engine running signal 19 to be inactive, i.e. at ground potential. With the engine running, the ignition signal 62 induces an oscillatory ignition sense signal 64 and the negative pulses of the oscillatory ignition sense signal 64 cause transistor $Q_4$ to conduct, which in turn causes transistor $Q_3$ to conduct, which in turn causes transistor $Q_2$ to conduct, thereby causing the engine running signal 19 to be active, i.e. at the potential V+. Resistor-Capacitor (RC) pairs $R_{14}$-$C_3$ and $R_{15}$-$C_2$ provide the filtering necessary to hold the engine running signal 19 active when the engine is running, and diode $D_2$ protects transistor $Q_4$ from positive pulses of the oscillatory ignition sense signal 64.

The headlight sensor 14 comprises a current sensor 24 that generates a current signal 28, a resistive bridge formed from a variable resistor $VR_1$ that generates a threshold signal 32, and a comparator 36, $U_2$ for comparing the current signal 28 and the threshold signal 32 so as to generate a headlight signal 20 that is active if the current signal 28 is greater than the threshold signal 32. The current sensor 24 comprises a magnetic flux sensor 66 and a magnetic flux collector 68 disposed about one of the battery cables 26. The magnetic flux collector 68 comprises a magnetically permeable material such as ferromagnetic band of steel or iron, a ferrite, or a metallic glass that encircles the battery cable 26, wherein the magnetic flux collector 68 contains a gap 70 within which is placed the magnetic flux sensor 66. Preferably, the magnetic flux sensor 66 comprises a Hall effect sensor, which generates a voltage responsive to the magnetic field passing therethrough. The magnetic flux sensor 66 and the magnetic flux collector 68 are preferably secured together and to the battery cable 26 with one or more wire-ties.

The battery 30—illustrated in FIG. 2 in a negative ground system—generates a battery current $I_{BAT}$ that is sensed by the current sensor 24, and which supplies the various loads, such as 34, 40, 42, 72 and 74, that are operatively coupled to the positive battery cable 76 either through one or more fuses 78, as is illustrated for loads 34, 40, 42 and 72; or directly, as is illustrated for load 74. The loads are typically controlled by respective switches 44, 46, 48, 82 and 84. The battery current $I_{BAT}$ is the sum of the currents to the respective loads activated by their corresponding switches. For example, if only the headlights 34 were on, then the battery current $I_{BAT}$ would be equal to the headlight current $I_{HL}$.

In operation, the battery current $I_{BAT}$ in the battery cable 26 creates a circulating magnetic field 38 around the battery cable 26 in accordance with the right-hand rule. The magnetic field 38 is concentrated by the magnetic flux collector 68. The Hall effect magnetic flux sensor 66 senses the magnetic field 38 in the magnetic circuit comprising the magnetic flux collector 68, the magnetic flux sensor 66, and any air gaps therebetween that remain from the gap 70 in the magnetic flux collector 68, and generates a current signal 28 that is proportional to the battery current $I_{BAT}$. The Hall effect magnetic flux sensor 66 is polarized relative to the direction of the magnetic field 38, as indicated by the polarization indicator P, and is powered by the electronic supply voltage V+ from the voltage regulator $VREG_1$. The battery current $I_{BAT}$ can be sensed from either the positive battery cable 76 or the negative battery cable 86, however as illustrated for the current sensor 24' sensing the battery current $I_{BAT}$ in the negative battery cable 86 the polarity P' of the Hall effect magnetic flux sensor 66 is reversed from than of the current sensor 24 sensing the battery current $I_{BAT}$ in the positive battery cable 76. The current signal 28 from the Hall effect magnetic flux sensor 66 is compared with the threshold signal 32 from a voltage dividing resistive bridge formed by variable resistor $VR_1$, wherein the variable resistor $VR_1$ is adjusted so the threshold signal 32 corresponds to the magnitude of the current signal 28 that results from a battery current $I_{BAT}$ corresponding to the headlight current $I_{HL}$ plus any other currents that would be drawn whenever the headlights 34 are on. Accordingly, whenever the headlights 34 are on, the current signal 28 exceeds the threshold signal 32 causing the comparator 36, $U_2$ to generate a headlight signal 20 that is active. Otherwise, the headlight signal 20 is inactive, i.e. near ground potential. The comparator 36, $U_2$ and threshold signal 32 circuits are powered by the electronic supply voltage $V^+$. Preferably, the threshold signal 32 is adjusted so that the headlight signal 20 will be active even if only one headlight 34 is operational.

The headlight signal 20 and the engine running signal 12 are operatively coupled to a microprocessor control circuit 16, $U_1$. One of ordinary skill in the are will appreciate that alternately, the control circuit could be implemented with discrete analog, digital, relay, or programmable logic components. The microprocessor $U_1$ operates in accordance with a control program 300 illustrated in FIGS. 3–5 to control, via output signal 88 through resistor $R_7$, and transistor switch $Q_1$, which in turn controls the activation of a buzzer 22 that is powered by the battery B that is the source of power for the headlight warning system 10. A setup switch $SW_1$, through resistive divider network $R_5$, $R_6$ powered by the electronic supply voltage $V^+$ generates a setup signal 90 that is operatively connected to an input port of the microprocessor $U_1$ for identifying when the headlight warning system is in a setup mode, which enables the user to adjust the variable resistor $VR_1$ controlling the threshold signal 32, thereby setting the current sensitivity of the current sensor 24.

Figure 3:
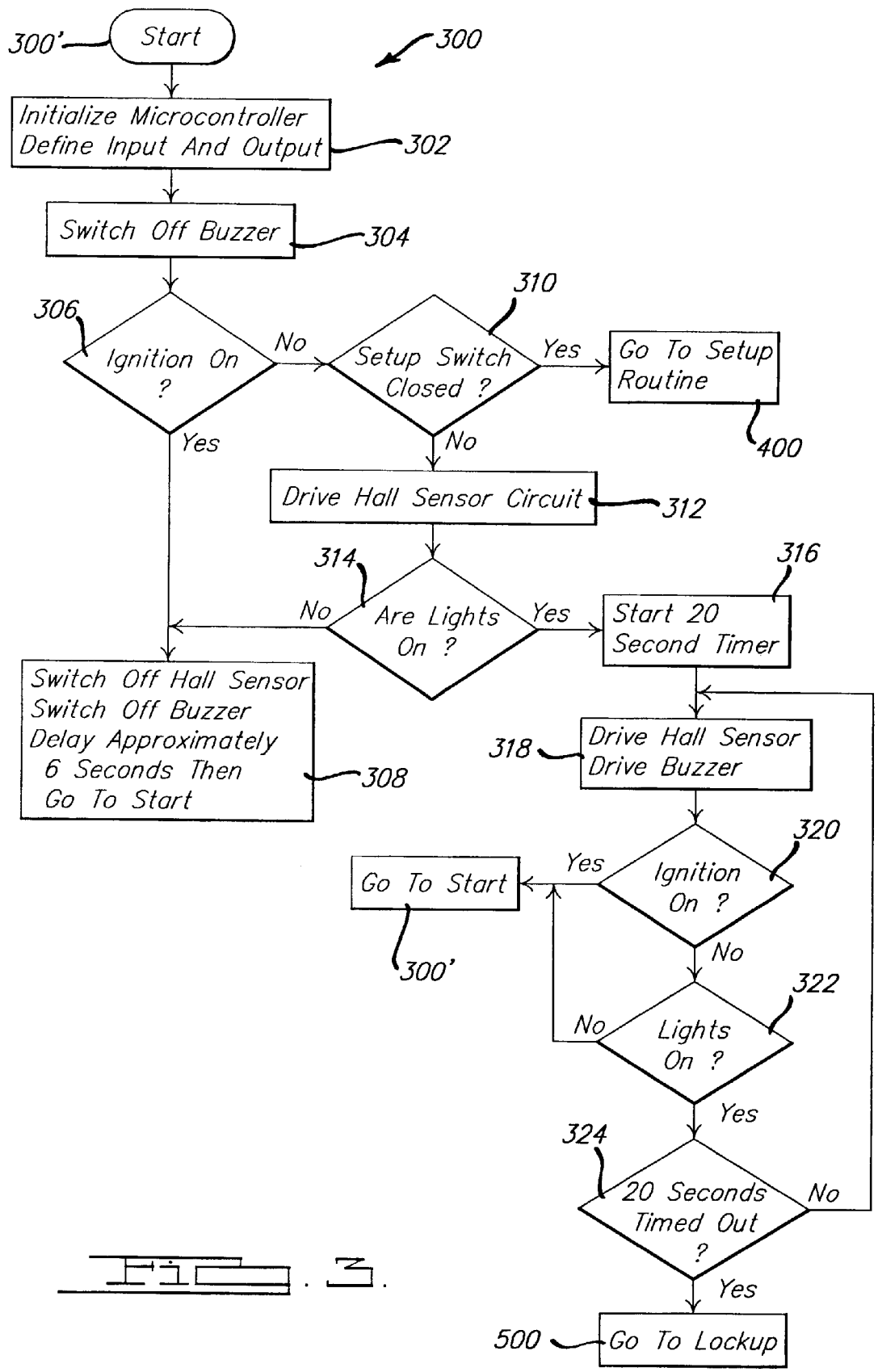
FIG. 3 is a flow chart of a program for implementing one embodiment of the instant invention.

Referring to FIG. 3, the control program 300, begins from a point of beginning (300') with step (302) to initialize the microprocessor $U_1$ and define the associated inputs and outputs. Then, in step (304), the buzzer 22 is switched off by deactivating the output signal 88, thereby tuning off transistor switch $Q_1$. Then, in step (306), if the ignition is on—as indicated for example by an engine running signal 19 that is active—then in step (308), the Hall effect magnetic flux sensor 66 is switched off by setting the ground signal 92 to an active level, i.e. a voltage substantially equal to the electronic supply voltage $V^+$. This also switches off the associated comparator 36, $U_2$ and threshold signal 32 circuits. Also in step (308), the buzzer 22 is switched off, and after a first delay period of approximately six (6) seconds, the program returns to the point of beginning (300'). Otherwise, from step (306), if the ignition is off, then in step (310) if the setup switch $SW_1$ is activated—as indicted by a setup signal 90 that is active—the program calls the setup subroutine 400 illustrated in FIG. 4 and described hereinbelow. Otherwise, in step (312), the Hall effect magnetic flux sensor 66 is switched on by setting the ground signal 92 to the ground level. Then, in step (314), if the headlights 34 are not on—as indicated by a headlight signal 20 that is inactive—the program jumps to step (308) described hereinabove. Otherwise, in step (316) the program starts a timer for measuring a second delay period of approximately twenty (20) seconds. During this second delay period, in step (318) the Hall effect magnetic flux sensor 66 is switched on by setting the ground signal 92 to the ground level, and the buzzer 22 is activated by activating the output signal 88. Then, in step (320), if the ignition is on—as indicated for example by an engine running signal 19 that is active—the program returns to the point of beginning (300'). Otherwise, in step (322) if the headlights 34 are off—as indicated by a headlight signal 20 that is inactive—then the program returns to the point of beginning (300'). Otherwise, in step (324), if the second delay period is over, the program calls the lockup subroutine 500 illustrated in FIG. 4 and described hereinbelow. Otherwise, the program returns to step (318) described hereinabove.

Figure 4:
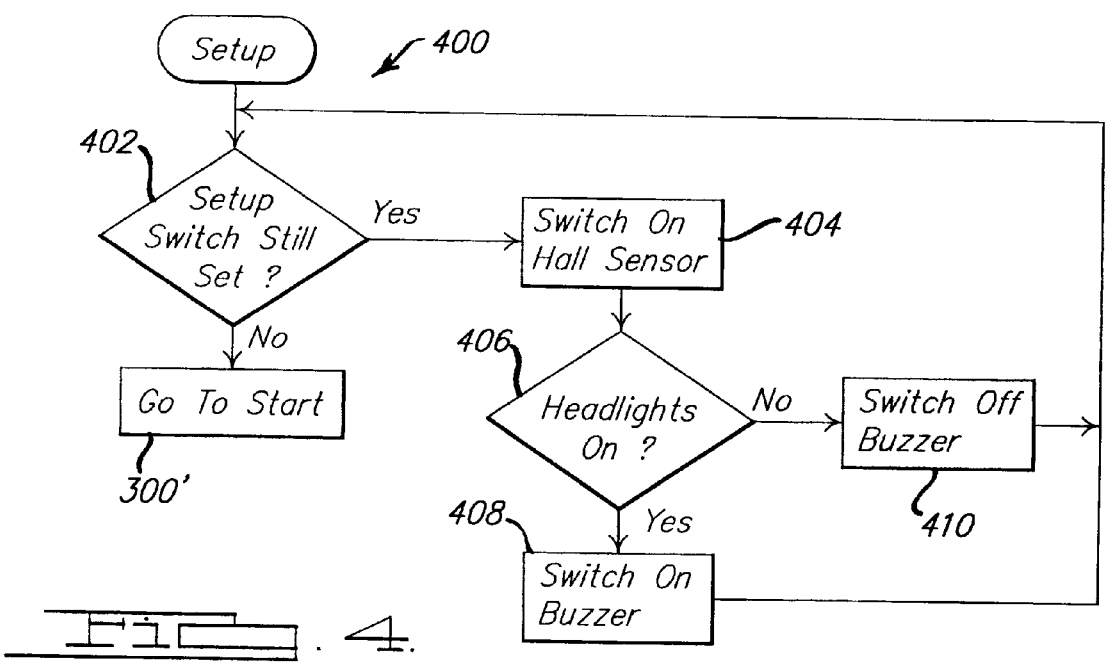
FIG. 4 is a flow chart of a subroutine that is called by the program illustrated in FIG. 3.

Referring to FIG. 4, the setup subroutine 400 begins in step (402) by checking to see if the setup switch $SW_1$ is activated, indicating that the headlight warning system 10 is in the setup mode that enables the user to adjust the variable resistor $VR_1$ setting the threshold signal 32 to cause the buzzer 22 to be activated when the headlights 34 are switched on, and to remain off when the headlights 34 are switched off, without interference from timeout features and other program logic. If the setup switch $SW_1$ is not activated, the program returns to the point of beginning (300'), resuming normal operation. Otherwise, in step (404) the Hall effect magnetic flux sensor 66 is switched on by setting the ground signal 92 to the ground level. Then in step (406), the headlight signal 20 is read to determine if the headlights 34 are on. If so, in step (408) the buzzer 22 is switched on by setting the output signal 88 to an active level. Otherwise, in step (410) the buzzer 22 is switched off by setting the output signal 88 to an inactive level. The program then returns to step (402) described hereinabove.

Figure 5:
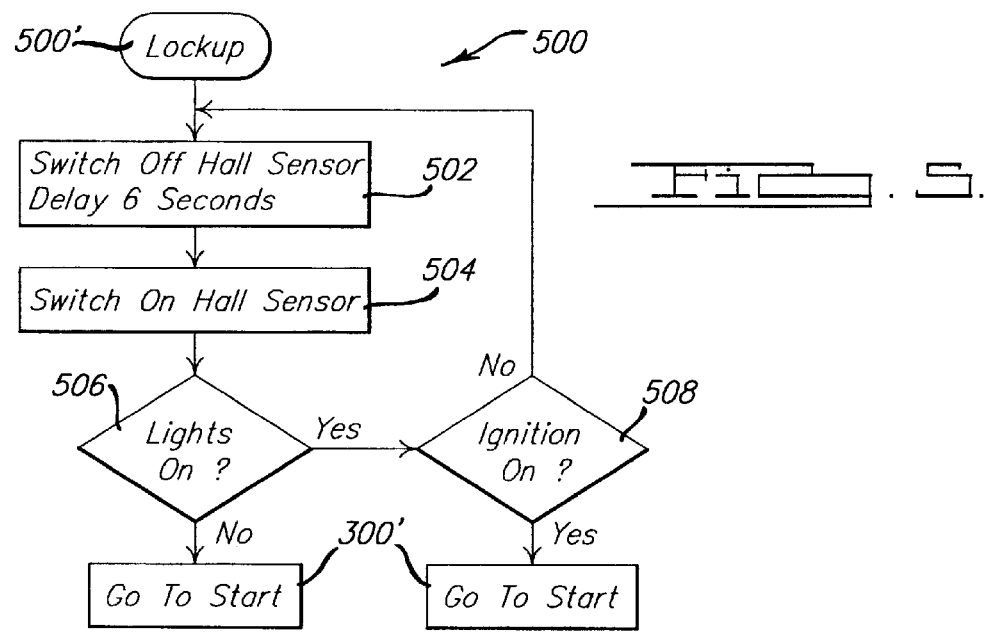
FIG. 5 is a flow chart of a subroutine that is called by the program illustrated in FIG. 3.

Referring to FIG. 5, the lockup subroutine 500 begins in step (502) by switching off the Hall effect magnetic flux sensor 66 by setting the ground signal 92 to the $V^+$ level and entering a third delay period of approximately six (6) seconds. After the third delay period has expired, then in step (504) the Hall effect magnetic flux sensor 66 is switched on by setting the ground signal 92 to the ground level. Then, in step (506), if the headlights 34 are not on—as indicated by a headlight signal 20 that is inactive—the program jumps to the point of beginning (300'). Otherwise, in step (508), if the ignition is on—as indicated for example by an engine running signal 19 that is active—the program returns to the point of beginning (300'). Otherwise the program returns to step (502) described hereinabove.

Figure 6A:
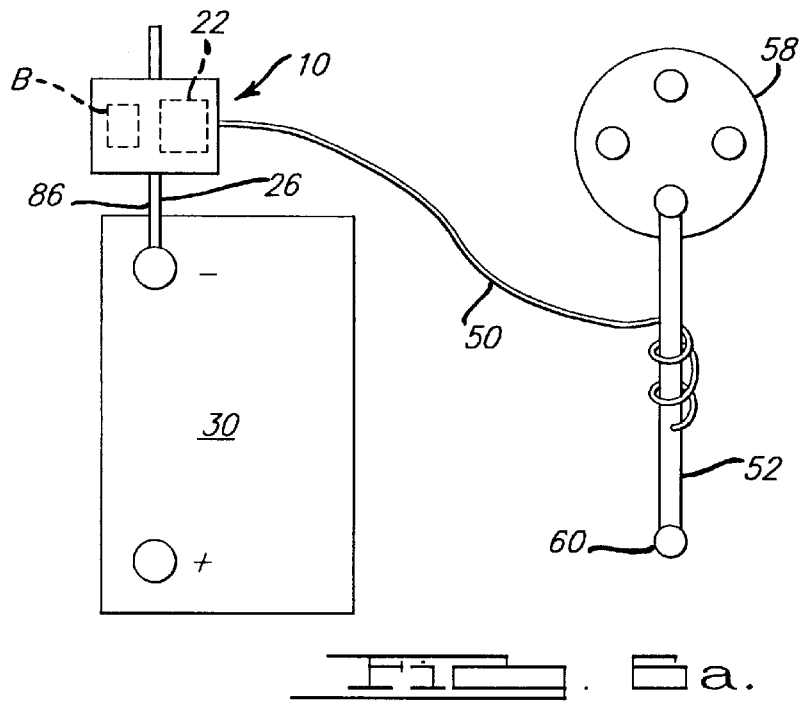
FIG. 6a illustrates the environment of the instant invention.
Figure 6B:
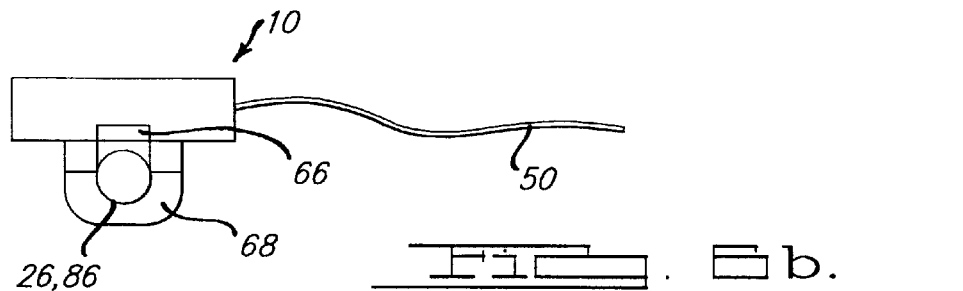
FIG. 6b illustrates an example of a physical arrangement of the instant invention.

Referring to FIGS. 6a and 6b, a self-contained headlight warning system 10 incorporates a ferrite or ferromagnetic magnetic flux collector 68 that is clamped around the negative battery cable 26, 86. The headlight warning system 10 incorporates a battery B and a buzzer 22. A wire from the headlight warning system 10 is wrapped around a spark plug wire 52 for sensing whether the engine is running. Accordingly, the instant invention is readily mounted—even by unsophisticated users—within the engine compartment of a motor vehicle without the need to break into, interfere with, or have knowledge of the vehicle electrical system. Furthermore, with the associated buzzer 22 located in the engine compartment, the user is more apt to hear the warning from outside the vehicle after having departed from the vehicle without first extinguishing the headlights, than might otherwise be the case if the buzzer 22 were located within the passenger compartment of the motor vehicle.

Prior to using the headlight warning system 10, the threshold signal 32 is first adjusted by closing setup switch $SW_1$ so as to activate the setup mode, during which time the buzzer 22 is directly responsive to the headlight sensor 14 and is not deactivated after the second delay period. The variable resistor $VR_1$ is then adjusted so that the buzzer 22 is activated with one or more headlights 34 on, but is not activated by other loads that the user may not wish to be warned about, such as the parking, brake, courtesy, or trunk lights.

After adjusting the current sensitivity of the headlight sensor 14, the headlight warning system 10 is returned to the normal mode of operation by opening the setup switch $SW_1$. The following scenarios illustrate the operation of the instant invention:

1. When the ignition is off, if the headlights 34 are on for a first preset period of time, then the buzzer 22 buzzes for a second preset period of time.
2. If the engine is started when the headlights 34 are on and the buzzer 22 is buzzing, then the buzzer 22 stops buzzing.
3. If the engine is turned off with the headlights 34 on, then after a first preset period of time, the buzzer 22 buzzes for a second preset period of time.
4. If the headlights 34 are turned off with the ignition off and the buzzer 22 buzzing, then the buzzer 22 stops buzzing. If the headlights 34 are turned back on for a first preset period of time, then the buzzer 22 starts buzzing.
5. With the headlights 34 on and the ignition off, the buzzer 22 buzzes for a second present period of time and then stops buzzing. If after a third preset period of time, the headlights 34 are then turned off and then back on for a first preset period of time, the buzzer 22 will start buzzing for a second preset period of time.

One of ordinary skill in the art will appreciate that other arrangements are possible within the scope of the instant invention. For example, the engine running sensor could use a signal from the ignition wire between the coil and the distributor, rather than between the distributor and one of the spark plugs. Alternately, the engine running sensor could utilize a signal from the vehicle ignition switch, from the oil pressure sensor, or from some other engine sensor that is responsive to whether or not the engine is likely to be running. As another example, the headlight sensor could be adapted to sense just the headlight current, by mounting the sensor proximate to a conductor that just carries headlight currents. Alternately, the instant invention could be used to warn of other than headlight currents being drawn from the vehicle battery after the engine is shut off. As another example, the instant invention could be used in a diagnostic mode to detect any appreciable current discharge, so as to determine if there is a current consuming fault in the electrical system, and if so, to assist in locating such a fault. Alternately, a plurality of current thresholds could be provided, for example to differentiate between one or two headlights so as to provide a warning to the driver when one of the headlights is burned out. Yet further, the instant invention could be adapted to provide a warning when there is a net or significant power discharge from the vehicle battery when the engine is operating, as would occur if there was a failure in the battery charging system. As yet another example, the controlled circuit could incorporate other types of warning devices, including audible, visual, or remote warning devices.

While specific embodiments have been described in detail in the foregoing detailed description and illustrated in the accompanying drawings, those with ordinary skill in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of the appended claims and any and all equivalents thereof.

I claim:
1. In a motor vehicle powered by a powerplant, said motor vehicle further comprising a motor vehicle battery that generates a battery current, a system for warning of discharge of said motor vehicle battery when said powerplant is not running, comprising:
   a) a means for detecting when the powerplant is not running;
   b) a means for sensing battery current from the magnetic field surrounding a battery cable;
   c) a means for comparing the sensed battery current with a threshold; and
   d) a means for generating a warning when the powerplant is not running and the sensed battery current exceeds said threshold.
2. The system as recited in claim 1, wherein said powerplant is an engine with an ignition system with at least one ignition cable and said means for detecting when the engine is not running comprises a means for detecting an ignition signal from the at least one ignition cable.
3. The system as recited in claim 1, wherein said means for sensing battery current comprises a magnetic flux sensor in a series magnetic circuit with a magnetic flux collector, said magnetic flux sensor and said magnetic flux collector proximate to said battery cable.
4. The system as recited in claim 3, wherein said magnetic flux sensor comprises a Hall effect sensor.
5. The system as recited in claim 3, wherein said magnetic flux collector comprises a magnetically permeable material.
6. The system as recited in claim 5, wherein said magnetically permeable material is selected from the group consisting of iron, steel, ferrite, and metallic glass.
7. The system as recited in claim 1, wherein the warning generated by said means for generating a warning commences after a first period of time.
8. The system as recited in claim 1, wherein the warning generated by said means for generating a warning terminates after a second period of time.
9. In a motor vehicle powered by an engine with an ignition system with at least one ignition cable, said motor vehicle further comprising at least one headlight that draws a headlight current when operational, said motor vehicle further comprising a motor vehicle battery, a headlight warning system, comprising:
   a) an engine running sensor, comprising:
      i). a conductor proximate to the at least one ignition cable, whereby when the engine is running, a first signal is induced in said conductor responsive to the operation of the ignition system; and
      ii). a detector for transforming said first signal into a second signal, whereby said second signal is active when the engine is running and said second signal is inactive when the engine is not running;
   b) a current sensor for generating a third signal, whereby said third signal is responsive to the headlight current;
   c) a threshold signal;
   d) a comparator for generating a fourth signal, whereby said fourth signal is active when said third signal is greater than said threshold signal, and said fourth signal is inactive when said third signal is less than said threshold signal;
   e) a warning device; and
   f) a control circuit, whereby said control circuit activates said warning device when said second signal is inactive and said fourth signal is active.

10. The headlight warning system as recited in claim 9, wherein said current sensor is responsive to the motor vehicle battery current.

11. The headlight warning system as recited in claim 9, wherein said current sensor comprises a magnetic flux sensor proximate to a current carrying conductor.

12. The headlight warning system as recited in claim 11, wherein said magnetic flux sensor comprises a Hall effect sensor.

13. The headlight warning system as recited in claim 11, wherein said current sensor further comprises a magnetic flux collector proximate to said current carrying conductor, whereby said magnetic flux sensor and said magnetic flux collector are magnetically in series with one another and collectively encircle said current carrying conductor.

14. The headlight warning system as recited in claim 13, wherein said magnetic flux collector comprises a magnetically permeable material.

15. The headlight warning system as recited in claim 14, wherein said magnetically permeable material is selected from the group consisting of iron, steel, ferrite, and metallic glass.

16. The headlight warning system as recited in claim 9, wherein said threshold signal is adjustable.

17. The headlight warning system as recited in claim 9, wherein said warning device comprises a buzzer.

18. The headlight warning system as recited in claim 9, further comprising a source of power for powering said detector, said current sensor, said threshold signal, said comparator, and said warning device.

19. The headlight warning system as recited in claim 18, wherein said source of power is distinct from the motor vehicle battery.

20. The headlight warning system as recited in claim 9, wherein said conductor is wrapped at least once around said ignition cable.

21. The headlight warning system as recited in claim 9, wherein said control circuit activates said warning device after a first period of time.

22. The headlight warning system as recited in claim 9, wherein said control circuit deactivates said warning device after a second of time.

23. The headlight warning system as recited in claim 9, wherein said warning device is deactivated responsive to said second signal being activated.

24. The headlight warning system as recited in claim 9, wherein said warning device is deactivated responsive to said fourth signal being deactivated.

25. The headlight warning system as recited in claim 9, wherein said control circuit comprises a microprocessor.

26. The headlight warning system as recited in claim 9, further comprising a switch, wherein when said switch is activated, said control circuit activates said warning device if said fourth signal is active and said control circuit deactivates said warning device if said fourth signal is inactive.

27. In a motor vehicle powered by a powerplant, said motor vehicle further comprising a motor vehicle battery that generates a battery current, a method of warning of discharge of said motor vehicle battery when said powerplant is not running, comprising the steps of:
   a) detecting if the powerplant is running;
   b) measuring the battery current;
   c) comparing the measurement of battery current to a threshold; and
   d) activating a warning device if the powerplant is not running and if the measurement of battery current exceeds a threshold.

28. The method as recited in claim 27, wherein the powerplant comprises an engine with an ignition system with at least one ignition cable and the step of detecting if the powerplant is running comprises inductively sensing an engine ignition signal from said at least one ignition cable.

29. The method as recited in claim 27, wherein the step of measuring the battery current comprises measuring the magnetic field generated by a conductor that conducts said battery current.

30. The method as recited in claim 27, wherein the step of activating a warning device occurs after a first period of time.

31. The method as recited in claim 27, further comprising the step of deactivating said warning device after a second period of time.

32. The method as recited in claim 27, further comprising the step of deactivating said warning device if the powerplant is running.

33. The method as recited in claim 27, further comprising the step of deactivating said warning device if the measurement of battery current is less than said threshold.

* * * * *